US012566371B2

(12) United States Patent　　　　　　(10) Patent No.:　US 12,566,371 B2

Hamamoto　　　　　　　　　　　　　　(45) Date of Patent:　Mar. 3, 2026

---

(54) IMPRINT DEVICE, IMPRINT METHOD, AND ARTICLE MANUFACTURING METHOD

(71) Applicant: CANON KABUSHIKI KAISHA, Tokyo (JP)

(72) Inventor: Ryosuke Hamamoto, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 138 days.

(21) Appl. No.: 18/538,343

(22) Filed: Dec. 13, 2023

(65) Prior Publication Data

US 2024/0210819 A1　　Jun. 27, 2024

(30) Foreign Application Priority Data

Dec. 22, 2022　(JP) ................................. 2022-205992

(51) Int. Cl.
G03F 7/00　　　　　(2006.01)
(52) U.S. Cl.
CPC ................................. G03F 7/0002 (2013.01)
(58) Field of Classification Search
CPC .... G03F 7/0002; G03F 7/0017; G03F 7/2012; G03F 7/7005; G03F 9/7042; G03F 9/7073; G03F 7/70; G03F 7/70091; G03F 7/70125; G03F 7/70141; G03F 7/70191; G03F 7/70208; G03F 7/703; G03F 7/7035; G03F 7/70383; G03F 7/70416; G03F 7/70425; G03F 7/70466; G03F 7/70475; G03F 7/70483–70541; G03F 7/7055; G03F 7/70558; G03F 7/708; G03F 7/7085; G03F 7/70975; G03F 7/70991; B29C 31/048; B29C 59/002; B29C 59/026

USPC ...................... 355/18, 52–55, 66–77, 78–132
See application file for complete search history.

(56) References Cited

U.S. PATENT DOCUMENTS

2007/0035056 A1 *　2/2007　Suehira ............... B29C 35/0888
　　　　　　　　　　　　　　　　　264/494
2011/0111593 A1 *　5/2011　Kanno ................... B82Y 10/00
　　　　　　　　　　　　　　　　　438/689
2013/0207288 A1 *　8/2013　Mikami ................ G03F 7/0002
　　　　　　　　　　　　　　　　　425/171
2016/0288404 A1　10/2016　Schumaker et al.
2019/0086796 A1 *　3/2019　Murasato .......... H01L 21/02345
(Continued)

FOREIGN PATENT DOCUMENTS

JP　　　　2016195242 A　　11/2016
KR　　1020200077443 A　　6/2020

*Primary Examiner* — Christina A Riddle

(74) *Attorney, Agent, or Firm* — ROSSI, KIMMS & McDOWELL LLP

(57)　　　　　　ABSTRACT

An imprint device that forms a pattern on a shot region of a substrate by using a mold is provided. The imprint device includes an irradiator configured to at least partially irradiate a pattern region of the mold with light, and a controller. The controller is configured to determine a partial region of the pattern region including a boundary between a first region including one or more recessed portions having a depth exceeding a predetermined value and a second region that is adjacent to the first region and does not include a recessed portion having a depth exceeding the predetermined value, based on unevenness information of the pattern region, and set a light irradiation amount to the partial region by the irradiator to be larger than a region other than the partial region.

11 Claims, 8 Drawing Sheets

(56)         References Cited

U.S. PATENT DOCUMENTS

| | | | | |
|---|---|---|---|---|
| 2019/0221421 | A1* | 7/2019 | Fukuhara | G03F 7/0002 |
| 2020/0189175 | A1* | 6/2020 | Nawata | H01L 21/3086 |
| 2020/0201171 | A1* | 6/2020 | Asada | G03F 7/0002 |
| 2020/0333704 | A1* | 10/2020 | Koide | G03F 7/0002 |
| 2021/0122089 | A1* | 4/2021 | Yoshida | B29C 35/0805 |

* cited by examiner

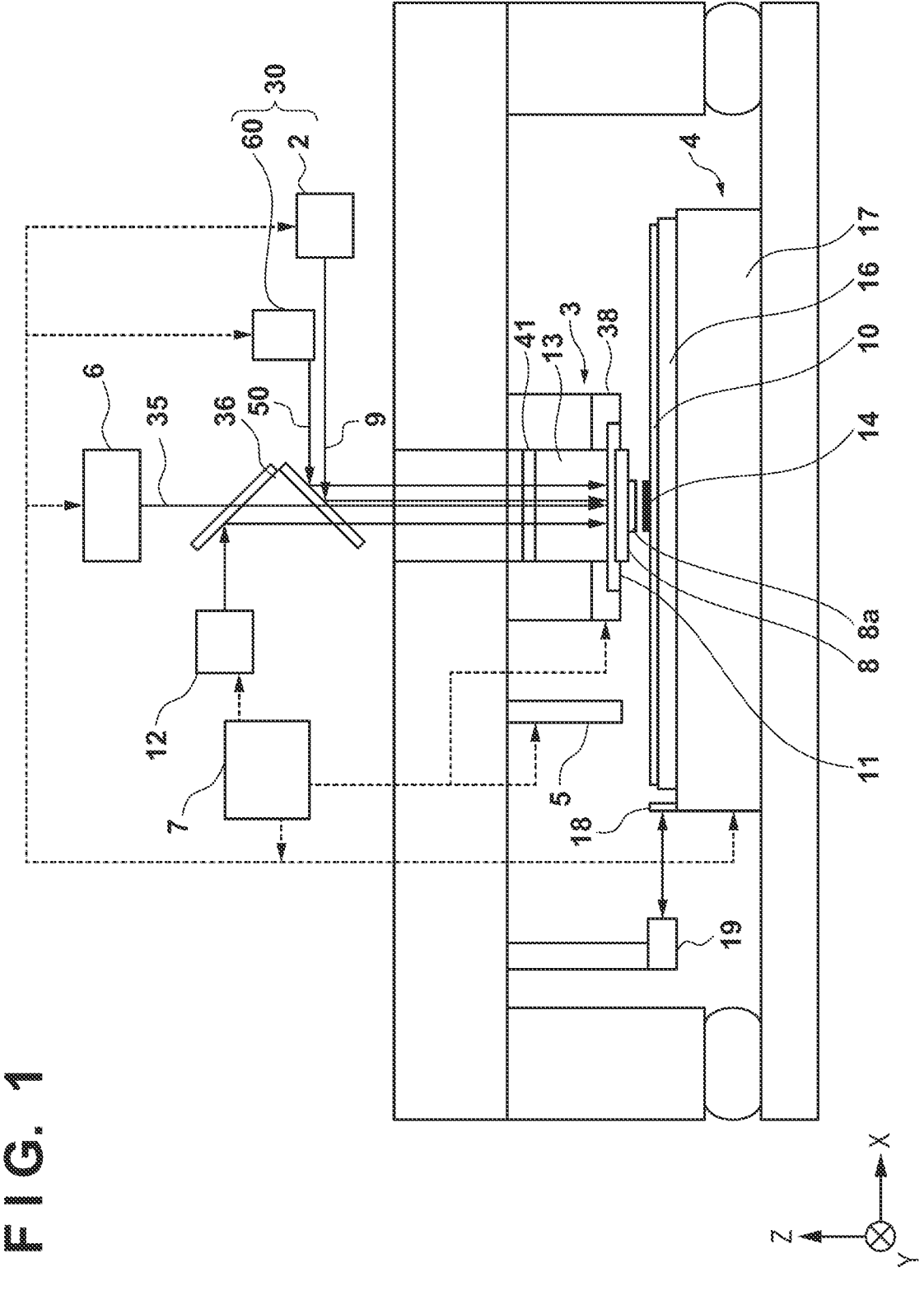
F I G. 1

IRRADIATION POSITION A

IRRADIATION POSITION B

FIRST REGION R1

B
Ba
Bt

IMPRINT DEVICE, IMPRINT METHOD, AND ARTICLE MANUFACTURING METHOD

BACKGROUND OF THE INVENTION

Field of the Invention

The present invention relates to an imprint device, an imprint method, and an article manufacturing method.

Description of the Related Art

With an increasing demand for miniaturization of semiconductor devices, MEMS, and the like, an imprint technique that can achieve high resolution at low cost has attracted attention. The imprint technique is a technique for transferring a pattern by pressing a mold on which an unevenness pattern is formed against an imprint material on a substrate. In the imprint technique, a layer of an imprint material called a residual layer remains between the substrate and the mold together with the unevenness pattern. Since the residual layer is unnecessary in the etching step after the pattern formation, it is necessary to remove the residual layer. Here, if the residual layer thickness is non-uniform, there is a possibility that the pattern shape formed by the imprint material may be destroyed when removing the residual layer. In particular, when the unevenness pattern configuration of the mold is distributed within the mold surface, the residual layer thickness tends to be non-uniform at the boundary portion.

On the other hand, Japanese Patent Laid-Open No. 2016-195242 discloses a method for determining an optimum arrangement pattern of an imprint material for a boundary portion including a part of each region in order to make a residual layer thickness uniform at a boundary between regions having different pattern configurations from each other within a surface of a mold.

However, when the pattern of the mold includes a deep recessed portion, it takes time to fill the recessed portion with the imprint material. Therefore, the imprint material may flow to the periphery before being filled in the recessed portion. In this case, the residual layer becomes thick at the periphery of the recessed portion, and the recessed portion may be filled with an insufficient amount of imprint material. In the related art, it is difficult to prevent the imprint material from flowing before filling the recessed portion.

SUMMARY OF THE INVENTION

The present invention provides a technique advantageous in maintaining uniformity of a residual layer thickness by accelerating the filling of a recessed portion of a pattern with an imprint material.

The present invention in its one aspect provides an imprint device that forms a pattern on a shot region of a substrate by curing an imprint material by irradiating the imprint material with light through a mold in a state in which the imprint material on the shot region of a substrate and the mold are in contact with each other, the imprint device including an irradiator configured to at least partially irradiate a pattern region of the mold with light, and a controller, wherein the controller is configured to determine a partial region of the pattern region including a boundary between a first region including one or more recessed portions having a depth exceeding a predetermined value and a second region that is adjacent to the first region and does not include a recessed portion having a depth exceeding the predetermined value, based on unevenness information of the pattern region, and set a light irradiation amount to the partial region by the irradiator to be larger than a region other than the partial region.

Further features of the present invention will become apparent from the following description of exemplary embodiments (with reference to the attached drawings).

BRIEF DESCRIPTION OF THE DRAWINGS

FIG. 1 is a diagram illustrating a configuration of an imprint device.

DESCRIPTION OF THE EMBODIMENTS

Figure 2:
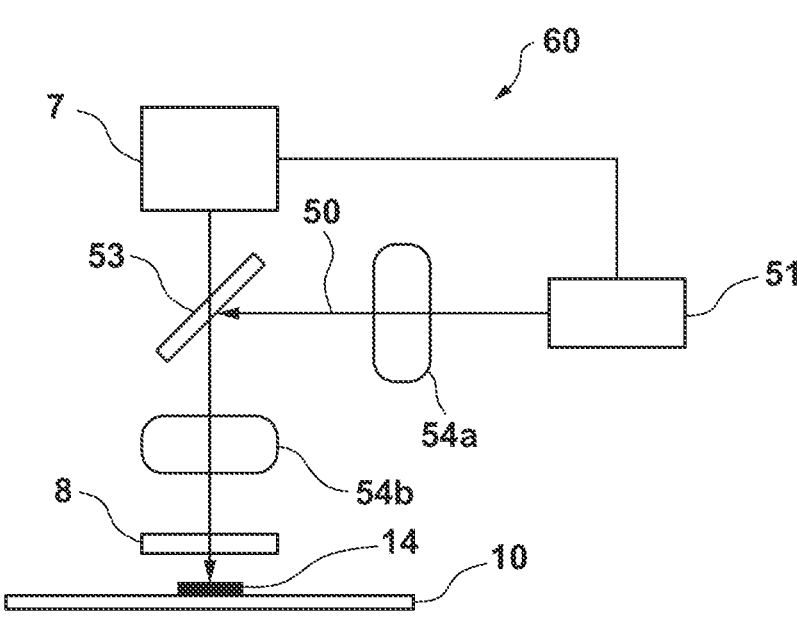
FIG. 2 is a diagram illustrating a configuration of a second irradiator.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 is a view showing the arrangement of an imprint device 1 according to an embodiment. In this specification and the attached drawings, directions are indicated in an XYZ-coordinate system where the horizontal plane as an XY plane. Generally, a substrate 10 is placed on a substrate holding unit 104 so that the surface of the substrate 10 is parallel to the horizontal plane (XY plane). Therefore, in the following, the directions orthogonal to each other in the plane along the surface of a substrate hoding surface of the substrate holding unit 104 are defined as the X-axis and the Y-axis, and the direction orthogonal to the X-axis and the Y-axis is defined as the Z-axis. Further, in the following, the directions parallel to the X-axis, Y-axis, and Z-axis in the XYZ coordinate system are referred to as an X direction, a Y direction, and a Z direction, respectively, and the rotation direction around the X-axis, the rotation direction around the Y-axis, and the rotation direction around the Z-axis are referred to as a θX direction, a θY direction, and a θZ direction, respectively.

Firstly, an overview of an imprint device according to an embodiment will be described. The imprint device is an apparatus that brings an imprint material supplied onto a substrate into contact with a mold and supplies curing energy to the imprint material to form a pattern of the cured material to which a concave-convex pattern of the mold is transferred.

As an imprint material, a curable composition (to be sometimes called an uncured resin) that is cured upon application of curing energy is used. As curing energy, electromagnetic waves, heat, or the like can be used. Electromagnetic waves can be, for example, light selected from the wavelength range of 10 nm or more and 1 mm or less, for example, infrared light, visible light, or ultraviolet light, or the like. A curable composition can be a composition that is cured by being irradiated with light or by being heated. Of these compositions, a photo-curable composition that is cured by being irradiated with light contains at least a polymerizable compound and a photopolymerization initiator, and may further contain a non-polymerizable compound or a solvent, as needed. A non-polymerizable compound is at least one type of compound selected from the group consisting of a sensitizer, hydrogen donor, internal mold release agent, surfactant, antioxidant, and polymer component. An imprint material supply apparatus can arrange an imprint material on a substrate in the form of droplets or islands or films formed from a plurality of droplets connected to each other. The viscosity (the viscosity at 25° C.) of the imprint material can be, for example, 1 mPa·s or more and 100 mPa·s or less. As a material for a substrate, for example, glass, ceramic, metal, semiconductor, or resin can be used. The surface of a substrate may be provided with a member made of a material different from that of the substrate, as needed. For example, a silicon wafer, a compound semiconductor wafer, silica glass, or the like is used as the substrate.

The imprint device 1 may include a mold holding unit 3 (imprint head) that holds and moves the mold 8, a substrate holding unit 4 (stage) that holds and moves the substrate 10, and a supply unit 5 (dispenser) that supplies an imprint material onto the substrate. Furthermore, the imprint device 1 may include an imaging unit 6 that images a contact state between the mold 8 and the imprint material 14 on the substrate 10 by irradiating light 35, and a controller 7 that controls the entire imprint device 1. Furthermore, the imprint device 1 may include a detection unit 12 that detects a mark (alignment mark) formed on the mold 8 or the substrate 10. In this embodiment, the imprint material 14 is an ultraviolet-curable imprint material. Therefore, the imprint device 1 irradiates the imprint material 14 with light through the mold 8 in a state where the imprint material 14 on the shot region of the substrate 10 and the mold 8 are in contact with each other, thereby curing the imprint material 14 to form a pattern on the shot region. The imprint device includes an irradiator 30 that at least partially irradiates the pattern region 8a of the mold 8 with light. In the example of FIG. 1, the irradiator 30 may include a first irradiator 2 that irradiates the entire surface of the pattern region 8a of the mold 8 with light 9 (e.g., ultraviolet rays) and a second irradiator 60 that irradiates only a partial region of the pattern region 8a of the mold 8 with light.

The substrate holding unit 4 includes a substrate chuck 16 that holds the substrate 10, and a substrate moving unit 17 that moves the substrate chuck 16 (i.e., the substrate 10) with respect to at least two axes of the X direction and the Y direction in the XYZ coordinate system. The substrate moving unit 17 includes, for example, an actuator. The position of the substrate holding unit 4 is determined using a mirror 18 and an interferometer 19 provided in the substrate holding unit 4. However, the position of the substrate holding unit 4 may be obtained by using an encoder instead of the mirror 18 and the interferometer 19.

The mold holding unit 3 includes a mold chuck 11 that holds the mold 8, and a mold moving unit 38 that moves the mold chuck 11 (i.e., the mold 8) with respect to at least one axis in the Z direction (up-down direction). The mold moving unit 38 includes, for example, an actuator. The mold moving unit 38 can bring the pattern region 8a of the mold 8 into contact with the imprint material 14 on the substrate by moving the mold chucks 11 downward (in the −Z direction). When the mold 8 (pattern region 8a) and the imprint material 14 on the substrate come into contact with each other, the controller 7 controls the force (pressing force) applied to the mold 8 and the imprint material 14 on the substrate to be constant.

In a state where the mold 8 (pattern region 8a) and the imprint material 14 on the substrate are in contact with each other, the first irradiator 2 irradiates the imprint material 14 on the substrate with the light 9 to cure the imprint material 14. After the curing of the imprint material 14 is completed, the mold chuck 11 is moved upward (in the +Z direction) by the mold moving unit 38 to separate the mold 8 from the cured imprint material 14 on the substrate (mold separation).

In the present embodiment, the mold moving unit 38 functions as a moving unit that relatively moves the mold 8 and the substrate 10 to bring the mold 8 and the imprint material 14 on the substrate into contact with each other, but this is not the sole case. For example, the pattern region 8a of the mold 8 and the imprint material 14 on the substrate may be brought into contact with each other by moving the substrate chuck 16 upward (in the −Z direction) by the substrate moving unit 17. Alternatively, the pattern region 8a of the mold 8 and the imprint material 14 on the substrate may be brought into contact with each other by moving the mold chuck 11 downward by the mold moving unit 38 and moving the substrate chuck 16 upward by the substrate moving unit 17. As described above, at least one of the substrate moving unit 17 and the mold moving unit 38 may function as a moving unit that relatively moves the mold 8 and the substrate 10 to bring the mold 8 and the imprint material 14 on the substrate into contact with each other.

The mold holding unit 3 that holds the mold 8 may include a posture adjustment unit that adjusts the tilt of the mold 8, and similarly, the substrate holding unit 4 that holds the substrate 10 may include a posture adjustment unit that adjusts the tilt of the substrate 10. The mold 8 and the substrate 10 can be made parallel to each other by correcting the relative tilt between the mold 8 and the substrate 10 using these posture adjustment units. The relative tilt between the mold 8 and the substrate 10 may be corrected by one of the mold holding unit 3 and the substrate holding unit 4, or may be corrected by both the mold holding unit 3 and the substrate holding unit 4.

The mold holding unit 3 is provided with a recessed portion for forming a space 13 defined by the partition plate 41 and the mold 8. The mold 8 (the pattern region 8a thereof) can be deformed when the mold 8 is brought into contact with the imprint material 14 on the substrate or when the mold 8 is separated from the cured imprint material 14 on the substrate by adjusting the pressure in the space 13. For example, when bringing the mold 8 and the imprint material 14 on the substrate into contact with each other, the pattern region 8a of the mold 8 and the imprint material 14 on the substrate can be brought into contact with each other in a state where the mold 8 is deformed into a convex shape with respect to the substrate 10 by increasing the pressure in the space 13.

The detection unit 12 detects a mark formed on the mold 8 and a mark formed on the substrate 10. The relative position (positional shift) between the mold 8 and the substrate 10 is obtained from the detection result of the detection unit 12, and at least one of the mold 8 and the substrate 10 is moved, whereby the mold 8 and the substrate 10 can be positioned (aligned).

The second irradiator 60 irradiates the substrate with the irradiation light 50. FIG. 2 is a diagram illustrating an example of a configuration of the second irradiator 60. The second irradiator 60 can include the light sources 51, the light modulation element 53, and optical elements 54a and 54b. The light source 51 emits light 50 having a wavelength at which the imprint material 14 undergoes a polymerization reaction. The light source 51 is a light source that can obtain an output necessary for causing the imprint material 14 to be subjected to polymerization reaction to a predetermined viscosity. The light source 51 includes, for example, a lamp, a laser diode, an LED, or the like. Light from the light sources 51 is guided to the light modulation element 53 (spatial light modulation element) via the optical element 54a. The light modulation element 53 can be formed of, for example, a digital micromirror device (DMD). However, the light modulation element 53 is not limited to the DMD, and may be configured by another element such as an LCD device or an LCOS device. The irradiation region can be controlled to an arbitrary position, and the intensity of the light 50 can be controlled to an arbitrary intensity by disposing the light modulation element 53 between the light source 51 and the substrate 10. The magnification at which the light 50 whose irradiation region and light intensity have been controlled by the light modulation element 53 is irradiated (projected) onto a desired region of the mold 8 is adjusted via the optical element 54b. The imprint material 14 on the substrate 10 is irradiated with the adjusted light 50. As a result, the imprint material 14 undergoes a polymerization reaction and increases to a predetermined viscosity.

The controller 7 can be configured by an information processing device (computer) including a CPU, a memory, and the like. The controller comprehensively controls each unit of the imprint device 1 according to a program stored in the memory. The controller 7 controls imprint process for forming a pattern in each shot region on the substrate and processes related thereto. The controller 7 may be provided inside or outside the imprint device 1.

Figure 3:
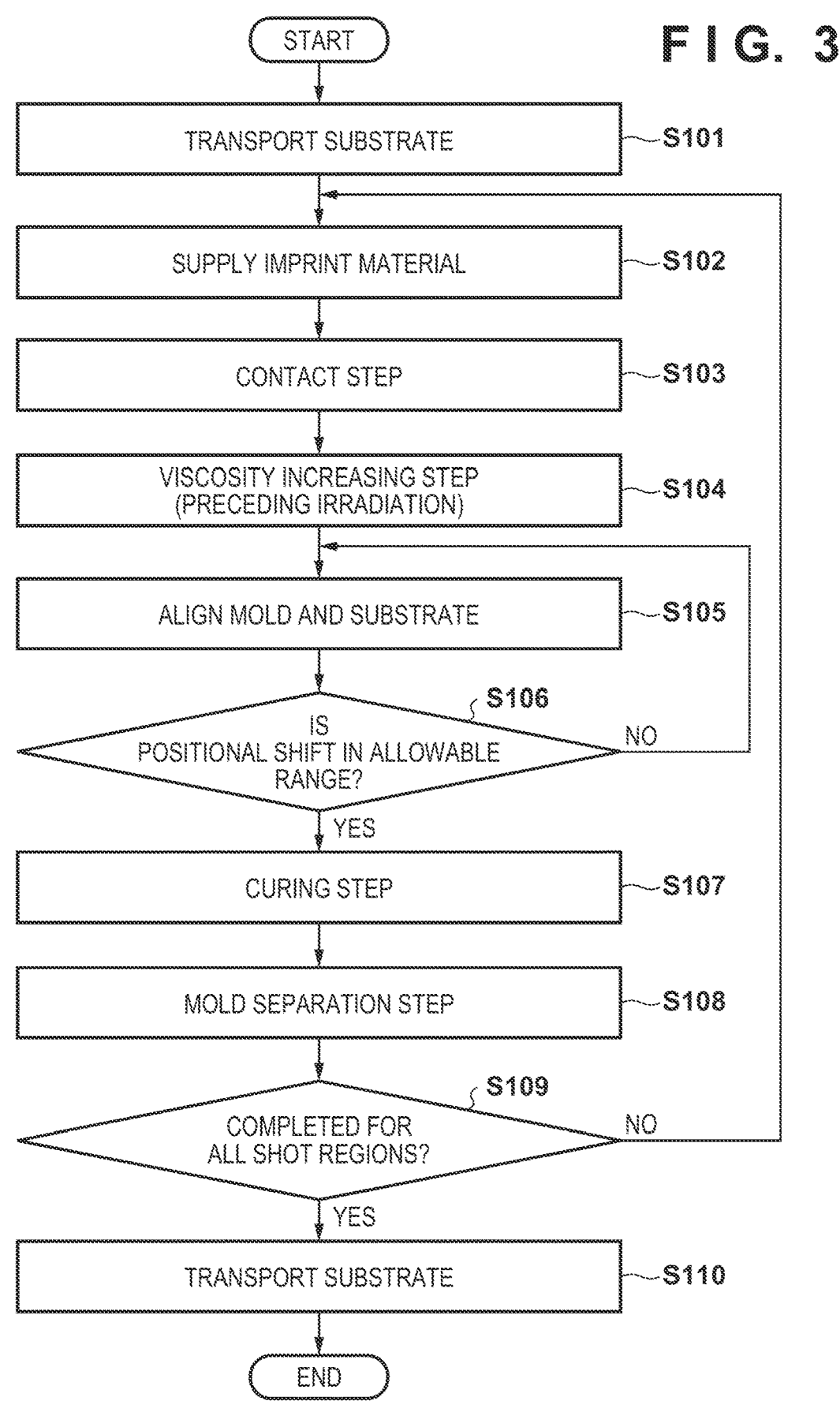
FIG. 3 is a flowchart of an imprint process.

The operation of the imprint device 1 according to the present embodiment will be described with reference to FIG. 3. FIG. 3 is a flowchart illustrating a procedure of a series of imprint processes for forming a pattern by shaping the imprint material 14 with the mold 8 for each shot region of the substrate 10.

In S101, the controller 7 controls a substrate transport device (not illustrated) to transport the substrate 10 into the imprint device 1. The substrate transport mechanism places the substrate 10 on the substrate chuck 16. The substrate chuck 16 holds the substrate 10.

In S102, the controller 7 controls the substrate moving unit 17 and the supply unit 5 to supply the imprint material 14 onto the shot region of the substrate 10 (supply step). At this time, as described above, the supply amount of the imprint material is adjusted so as to have a distribution corresponding to the volume of the pattern unevenness of the mold 8.

In S103, the controller 7 controls the mold moving unit 38 and/or the substrate moving unit 17 to bring the pattern region 8a of the mold 8 and the imprint material 14 on the shot region of the substrate 10 into contact with each other (contact step).

In S104, the controller 7 determines the irradiation region (partial region) based on the unevenness information of the pattern region 8a, and controls the second irradiator 60 to irradiate only the partial region with the irradiation light 50 to increase the viscosity of the imprint material (viscosity increasing step). S104 is a step of performing irradiation with the irradiation light 50 prior to the alignment of S105 and the curing step of S107 described later, and this is also referred to as preceding irradiation. Details of S104 will be described later.

In S105, the controller 7 aligns the mold 8 and the substrate 10. The alignment between the mold 8 and the substrate 10 is performed after the contact step (S103) of bringing the mold 8 into contact with the imprint material 14 on the substrate is completed and the pattern of the pattern region 8a of the mold 8 is sufficiently filled with the imprint material 14. For example, the controller 7 detects a mark formed on the mold 8 and a mark formed on the substrate 10 using the detection unit 12 and performs alignment between the mold 8 and the substrate 10 based on the detection result.

The alignment in S105 may be performed after the start of the preceding irradiation in S104. The preceding irradiation and the alignment may be performed in an overlapping manner.

In S105, relative alignment between the mold 8 and the substrate 10 is performed, but correction of distortion that may be derived from the substrate 8, the mold 10, the imprint device 1, or any combination thereof is not performed. The distortion includes a pattern error formed in the mold 8, or a pattern distortion of the mold 8 or a distortion of the substrate 10 due to a flatness deviation in the supporting surface of the substrate holding unit 4 or the chuck region of the mold holding unit 3, the main surface of the substrate 10, the main surface of the mold 8, or any combination thereof. All of these distortions affect the superposition accuracy.

In S106, the controller 7 determines the alignment accuracy. If the alignment accuracy satisfies the allowable value, the process proceeds to S107. If the alignment accuracy does not satisfy the allowable value, the process returns to S105 and the alignment step is continued. When the alignment accuracy does not satisfy the allowable value in the S106 even if the alignment step is repeated a predetermined number of times or more, the process may be forcibly proceeded to S107.

After the alignment is completed, in S107, the controller 7 controls the first irradiator 2 so that the imprint material 14 is irradiated with the light 9 in order to cure the imprint material 14 in a state where the mold 8 and the imprint material 14 are in contact with each other (curing step). The first irradiator 2 irradiates the entire surface of the pattern region 8a with light.

In S108, the controller 7 controls the mold moving unit 38 and/or the substrate moving unit 17 to separate the mold 8 from the cured imprint material 14 on the shot region of the substrate 10 (mold separation step).

In S109, the controller 7 determines whether or not the imprint process has been completed for all the shot regions on the substrate 10. When the imprint process is completed for all the shot regions, the process proceeds to S110. If the imprint process is not completed for all the shot regions, the process returns to the S102, and the imprint process is performed for the next shot region.

In S110, the controller 7 controls the substrate transport device to transport the substrate 10 to the outside of the imprint device 1.

The flow of a series of imprint processes on the substrate 10 has been described above. Next, details of S104 will be described. As described above, S104 is the viscosity increasing step of determining the irradiation region based on the unevenness information of the pattern region, controlling the second irradiator 60 to emit the irradiation light 50, and increasing the viscosity of the imprint material.

The reason for executing the viscosity increasing step of S104 will be described. In the supply step of S102, the supply amount of the imprint material 14 is supplied so as to have a distribution corresponding to the volume of the pattern unevenness of the mold 8. This is because if the imprint material is not supplied by the volume to be filled in accordance with the unevenness of the pattern of the mold, excess or deficiency of the imprint material occurs, and the recessed portion of the mold is not filled with the imprint material, or the residual layer thickness is not constant. However, even if the imprint material is supplied in accordance with the pattern volume of the mold as described above, the imprint material flows to the periphery before filling the pattern recessed portion when the filling speed into the pattern recessed portion of the mold is slow. Then, the residual layer thickness of a place to where the imprint material has flowed becomes relatively thick, and the imprint material necessary for filling may become insufficient in the pattern recessed portion and the recessed portion may remain unfilled. In order to prevent such a problem, it is necessary to prevent the imprint material from flowing to the periphery until the filling of the pattern recessed portion is completed. Therefore, in the present embodiment, the viscosity of the imprint material is increased by the irradiation light in S104. When S104 is executed, the filling of the imprint material into the pattern recessed portion of the mold 8 is promoted, and the residual layer thickness uniformity in the vicinity thereof can be maintained. In general, the deeper the pattern is, the longer it takes to fill the pattern recessed portion.

Figure 4:
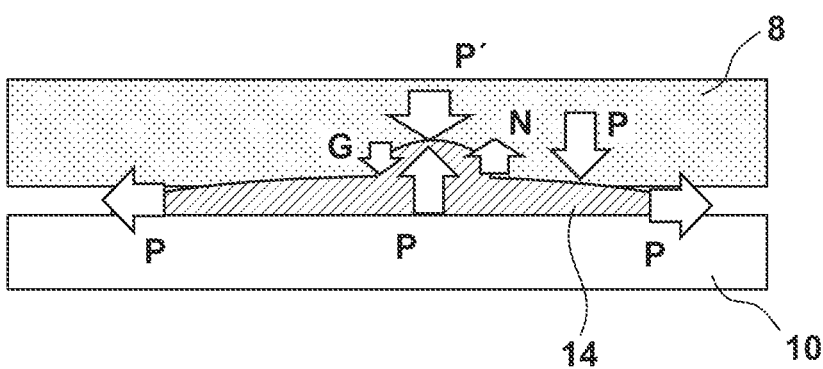
FIG. 4 is a schematic view showing a force applied to the imprint material in a contact step.

FIG. 4 is a schematic view illustrating a part of the force applied to the imprint material 14 when the imprint material 14 on the substrate 10 comes into contact with the mold 8 in the contact step of S103. When the imprint material 14 comes into contact with the mold 8 on the substrate 10, the imprint material receives the pressure P from the mold 8, and spreads to the periphery by the amount crushed by the contact. Furthermore, when there is a pattern recessed portion in the mold 8 at the time of contact, the imprint material 14 fills the pattern recessed portion by capillary phenomenon. At this time, the imprint material 14 in the pattern recessed portion receives a pressure P received from the mold 8 and a force N by which the liquid surface is pulled up by surface tension, as a force in the direction of filling the pattern recessed portion. At the same time, the imprint material 14 in the pattern recessed portion is subjected to a force P' received from gas in the pattern recessed portion and a gravity G acting on the imprint material 14 as a force that prevents filling in the opposite direction. Therefore, the filling time into the pattern recessed portion depends on the force relationship between (P+N) and (P'+G).

In the present embodiment, the gravity G acting on the imprint material with respect to the filling time does not contribute much because the volume of the imprint material is very small, and the contribution of the force P' received from the gas in the pattern recessed portion is large. Since the pattern recessed portion is a closed space, P' becomes larger as the pattern becomes deeper. Therefore, the deeper the pattern, the slower the filling time of the pattern recessed portion. Therefore, the viscosity increasing step of S104 is required.

Here, the reason why the viscosity increasing step of S104 is required has been described using the pattern recessed portion which takes time to fill. However, the present step can be useful not only for pattern recessed portions but also for all the places where a relative difference occurs in the filling time. This is because if there is a relative difference in filling time, the imprint material flows according to the difference in filling time. As described above, when the imprint material flows to the periphery before filling, the residual layer thickness of the flow destination of the imprint material becomes relatively thick, whereas the imprint material necessary for filling may be insufficient at the flow source. A place where the imprint material is insufficient may eventually become an unfilled defect.

Figure 5:
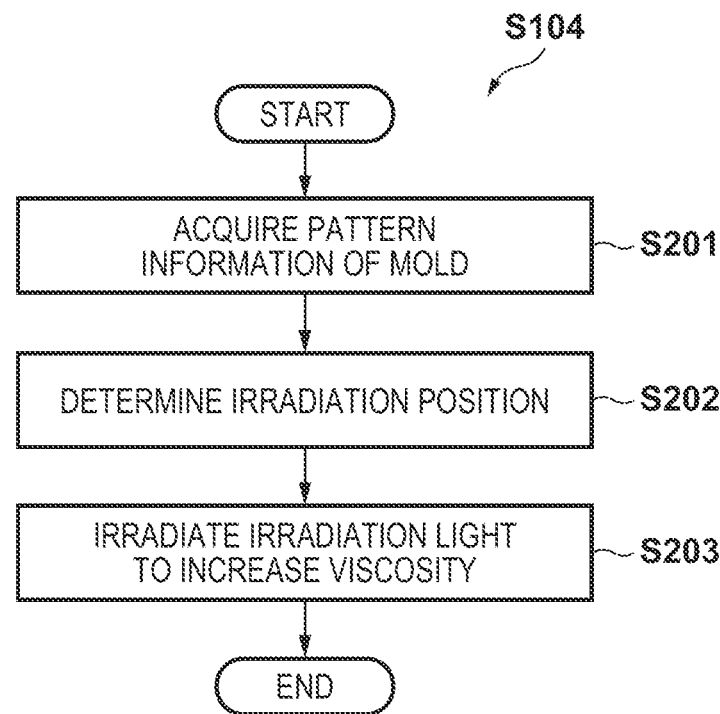
FIG. 5 is a flow chart of a viscosity increasing step.

Details of the viscosity increasing step in S104 will be described with reference to FIG. 5. First, in S201, the controller 7 acquires the unevenness information of the pattern region 8a of the mold 8. The unevenness information may include information indicating what shape and arrangement of unevenness are present in the pattern region 8a.

In S202, the controller 7 determines the irradiation position (preceding irradiation position) of the irradiation light 50 based on the information obtained in S201. For example, the controller 7 determines, as the irradiation position, a boundary between a region having a deep recessed portion that takes time to fill and a region on the outer side thereof. The controller 7 determines, based on the acquired unevenness information, a partial region of the pattern region 8a including a boundary between a first region including one or more recessed portions having a depth exceeding a predetermined value and a second region adjacent to the first region and not including a recessed portion having a depth exceeding the predetermined value as the irradiation position. The determination process of the preceding irradiation position may be executed by a dedicated processing unit different from the controller 7. In the present embodiment, the controller 7 has been described as including the function of such a processing unit.

Figure 6A:
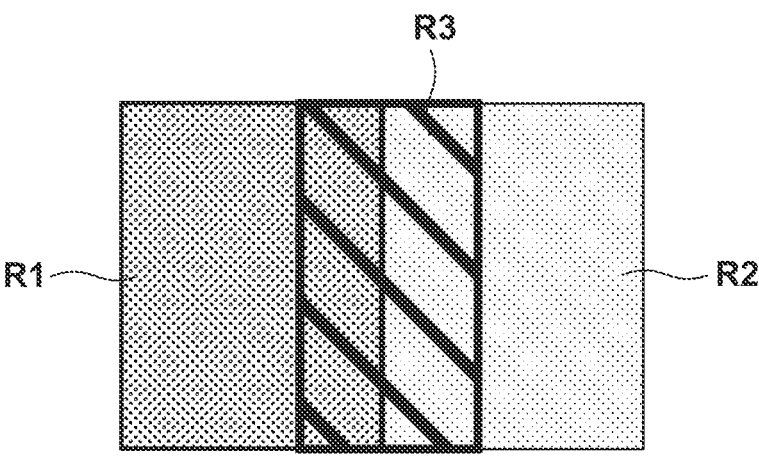
FIGS. 6A to 6C are diagrams illustrating an irradiation position in the viscosity increasing step.

A specific method of determining the irradiation position will be described with reference to FIG. 6A. In FIG. 6A, the first region R1 is a region having a deep recessed portion that takes time to fill. Here, a recessed portion having a depth exceeding a predetermined value is defined as a deep recessed portion that takes time to fill. The second region R2 is a region that is adjacent to the first region R1 and does not include a recessed portion having a depth exceeding the predetermined value. A third region R3 indicated by hatching is a partial region of the pattern region 8a including a boundary between the first region R1 and the second region R2. This partial region is determined as the irradiation position. In one example, a "recessed portion having a depth exceeding a predetermined value" is a recessed portion having a depth of greater than or equal to 80 nm. Note that the specific value of 80 nm is a value tentatively determined by examination of the inventor, and is merely an example. In one example, the first region R1 is a chip pattern region including a plurality of recessed portions having a depth of greater than or equal to 80 nm, and the second region R2 is a region not including a recessed portion having a depth of greater than or equal to 80 nm. Here, the chip pattern region corresponds to one chip (die) to be manufactured, and is a region in which a pattern is formed in the chip. In this case, the controller 7 can determine the outer peripheral portion of the chip pattern region as the third region D3 (partial region (irradiation position)). In the example of FIG. 6A, controller 7 can determine the third region D3 such that third region D3 is located across first region R1 and second region R2.

In S203, the controller 7 controls the second irradiator 60 to perform preceding irradiation of the irradiation light 50 on the third region R3 determined as the partial region (irradiation position) in S202.

As described above, in the present embodiment, the irradiation position is determined based on the unevenness information of the pattern region 8a of the mold 8, and the preceding irradiation is performed on the determined irradiation position with the irradiation light to increase the viscosity of the imprint material. This can prevent the imprint material from flowing to the periphery of the deep recessed portion before the imprint material fills the deep recessed portion.

As described above, in the present embodiment, the light irradiation amount to the partial region (irradiation position) by the irradiator 30 is made larger than the region other than the partial region. As a result, according to the present embodiment, an imprint device that realizes rapid filling of the imprint material into the deep recessed portion and is advantageous for maintaining the residual layer thickness uniformity can be provided.

In addition, in the above example, a recessed portion of greater than or equal to 80 nm is treated as a deep recessed portion that takes time to fill. However, this depth cannot be determined unconditionally since it depends on the combination of the imprint material to be used and the material of the mold, the air pressure in the imprint device, the atmosphere, and the like. Therefore, it is desirable to search for a suitable depth by a separate experiment or the like. An experiment for determining a deep recessed portion that takes time to fill may be performed by skipping the viscosity increasing step of S104 and examining an unfilled place in the substrate surface after the imprint process. The recessed portion which is finally an unfilled place is a recessed portion which is slowly filled. Therefore, the recessed portion which is the unfilled place may be determined as a deep recessed portion which takes time to fill. In particular, the difference in filling speed according to the depth of the recessed portion becomes clearer by shortening the time from S103 (contact step) to S107 (curing step). As still another experimental method, there is a method in which S104 step is skipped and the distribution of the residual layer thickness in the substrate surface is examined after the imprint process. As described above, since the distribution of the residual layer thickness is caused by the imprint material flowing from the recessed portion having a relatively long filling time, a deep recessed portion that takes time to fill can be determined from the correlation between the region where the residual layer thickness is thin and the depth of the recessed portion in the vicinity thereof.

In the above embodiment, the example in which the chip pattern region including the plurality of recessed portions having the depth exceeding the predetermined value is set as the first region R1 has been described. However, the first region R1 may be a region including only one recessed portion having a depth exceeding a predetermined value.

Figure 6B:
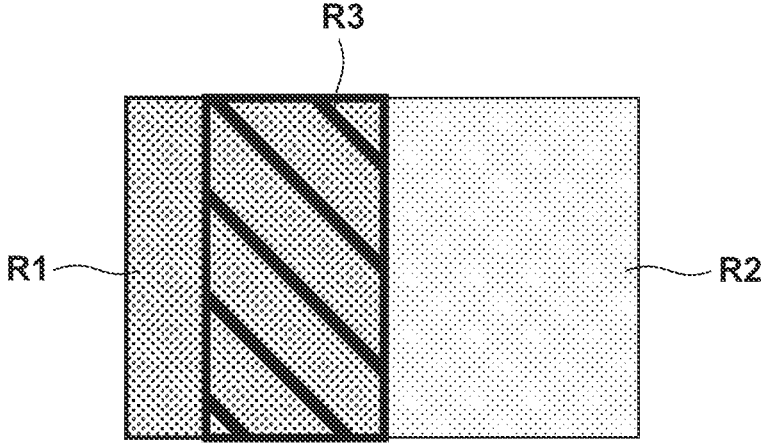
Figure 6C:
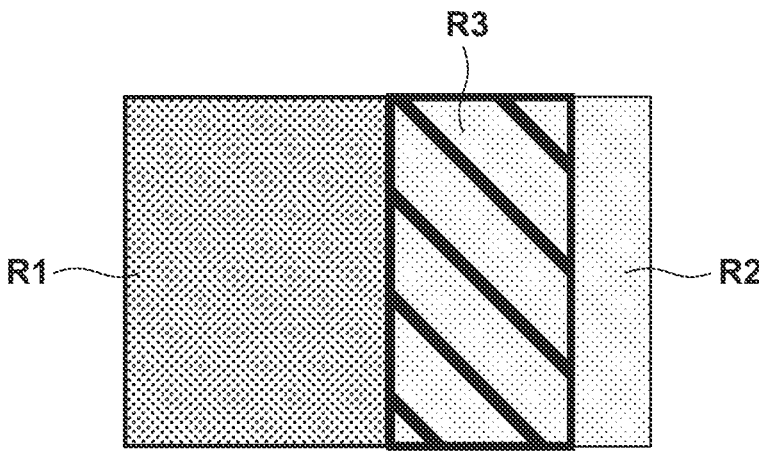

Furthermore, in the above embodiment, as illustrated in FIG. 6A, the third region R3 extending over the first region R1 including the deep recessed portion and the second region R2 on the outer side of the first region R1 is determined as the irradiation position. However, as illustrated in FIG. 6B, controller 7 may determine the third region R3 such that the entire region of third region R3 that is the partial region is included in the first region R1, and the end of the third region R3 is located at the boundary of the first region R1 and the second region R2. Alternatively, as illustrated in FIG. 6C, controller 7 may determine the third region R3 such that the entire region of third region R3 that is the partial region is included in the second region R2, and the end of the third region R3 is located at the boundary between first region R1 and second region R2. The position to be set as the irradiation range may be determined depending on a relative difference in filling speed between the first region R1 and the second region R2. Therefore, it is desirable to search for the optimum condition by a separate experiment or the like.

In addition, in S203, the intensity of the irradiation light 50 and the irradiation timing of the irradiation light 50 necessary for the viscous change of the imprint material 14 vary depending on the type of the imprint material 14 or the like, and thus it is preferable to search for values of the intensity and the irradiation timing through experiments.

In addition, in the above embodiment, the third region R3 extending over the first region R1 having the deep recessed portion that takes time to fill and the second region R2 on the outer side thereof is set as the irradiation position. However, as described above, the present embodiment is useful for all places where a relative difference in filling time occurs. Therefore, the present invention can be applied to a boundary of a region having a pattern density different from that of the peripheral region, a boundary of a region having an aspect ratio different from that of the surrounding region, or the like, where a difference in filling time is likely to occur. The characteristics of these target molds can be known by examining the distribution of unfilled places and residual layer thicknesses in the substrate surface after the imprint process, as described above.

Second Embodiment

In the second embodiment, when determining the irradiation position in S202, the irradiation position is determined based on the information on the irradiation position based on the unevenness information of the pattern of the mold shown in the first embodiment and the irradiation information for obtaining a predetermined viscosity of the imprint material suitable for alignment.

In order to improve the filling property to the recessed portion of the mold, the viscosity of the imprint material is preferably low. On the other hand, when the viscosity of the imprint material is low, positional shift between the mold and the substrate easily occurs due to disturbance, and the alignment accuracy tends to lower. When the viscosity of the imprint material is increased to some extent, the imprint material becomes a resistance, and the positional shift between the mold and the substrate is less likely to occur, so that the alignment accuracy is improved.

Figure 7:
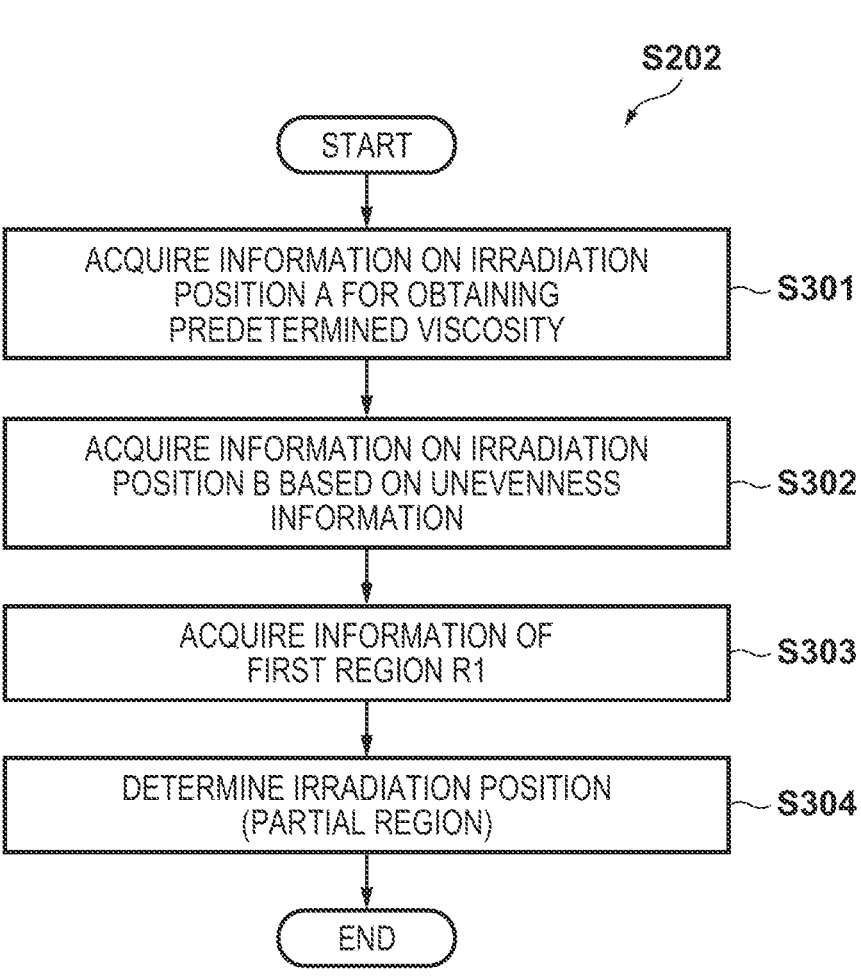
FIG. 7 is a flowchart of a step of determining an irradiation position.

Therefore, in the present embodiment, it is made possible to perform, in parallel, irradiation for assisting filling of a region that takes time to fill as described in the first embodiment and irradiation for assisting alignment between the mold and the substrate. A specific example will be described with reference to FIGS. 7 and 8. FIG. 7 is a flowchart of the irradiation position determination in S202, and FIG. 8 is a diagram illustrating an example of the irradiation position determined according to the flow.

In step S301, the controller 7 acquires information on the irradiation position A from the irradiation information for obtaining a predetermined viscosity of the imprint material.

Figures 8A, 8B, 8C, 8D:
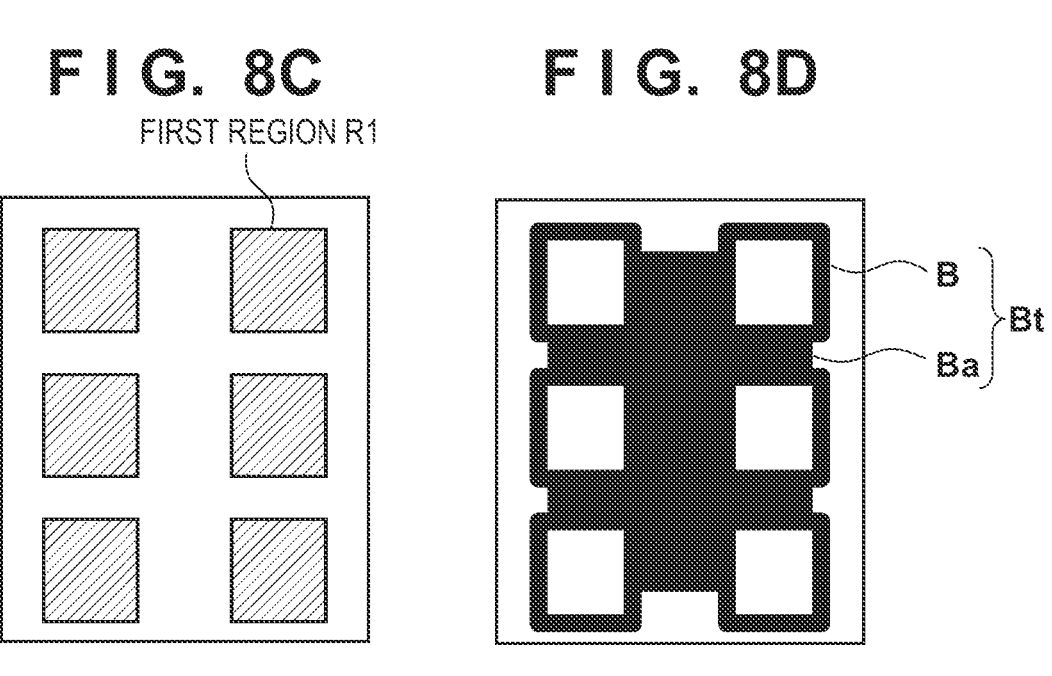
FIGS. 8A to 8D are diagrams showing an example of an irradiation position.

The irradiation position A may be, for example, a position including the center of the shot region such as the shaded region illustrated in FIG. 8A.

In step S302, the controller 7 acquires information on the irradiation position B based on the unevenness information of the pattern of the mold 8. The irradiation position B may be a position indicated by a thick black line portion illustrated in FIG. 8B. For example, the irradiation position B may be an outer peripheral portion of the first region R1 constituting a chip pattern region including a plurality of recessed portions having a depth exceeding a predetermined value as described in the first embodiment.

In S303, the controller 7 acquires information of the first region R1 having the deep recessed portion that takes time to fill. FIG. 8C illustrates an example of the first region R1.

In S304, the controller 7 determines the final irradiation position (partial region) based on the obtained information of the irradiation region A, the irradiation position B, and the first region R1. For example, the controller 7 obtains a region Ba (FIG. 8D) (additional partial region) obtained by removing the first region R1 from a region where the irradiation region A (FIG. 8A) for obtaining predetermined viscosity and the first region R1 (FIG. 8C) are superimposed. The controller 7 determines a region Bt obtained by adding the irradiation position B and the region Ba as a final irradiation position (partial region). In this manner, the controller 7 determines the additional partial region of the pattern region for obtaining the predetermined viscosity of the imprint material, and determines the partial region so as to include the additional partial region. In FIG. 8D, the irradiation position determined in this manner is indicated by a black portion.

This makes it possible to quickly fill the deep recessed portion with the imprint material, maintain the residual layer thickness uniformity, and improve the accuracy of alignment between the mold and the substrate.

When the first region R1 is excluded from the irradiation position and thus a desired viscosity for improving the alignment accuracy cannot be obtained, the irradiation area may be increased in a portion other than the first region R1. Alternatively, the desired viscosity may be obtained by adjusting the intensity and timing of the irradiation light or the desired viscosity may be obtained by changing the irradiation position with time.

Embodiment of Method of Manufacturing Article

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as at least some of the constituent members of the above-described articles or used temporarily as a resist mask. After etching or ion implantation is performed in the substrate processing step, the resist mask is removed.

A method of manufacturing an article will be described next. As shown step SA of FIG. 9, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 9:
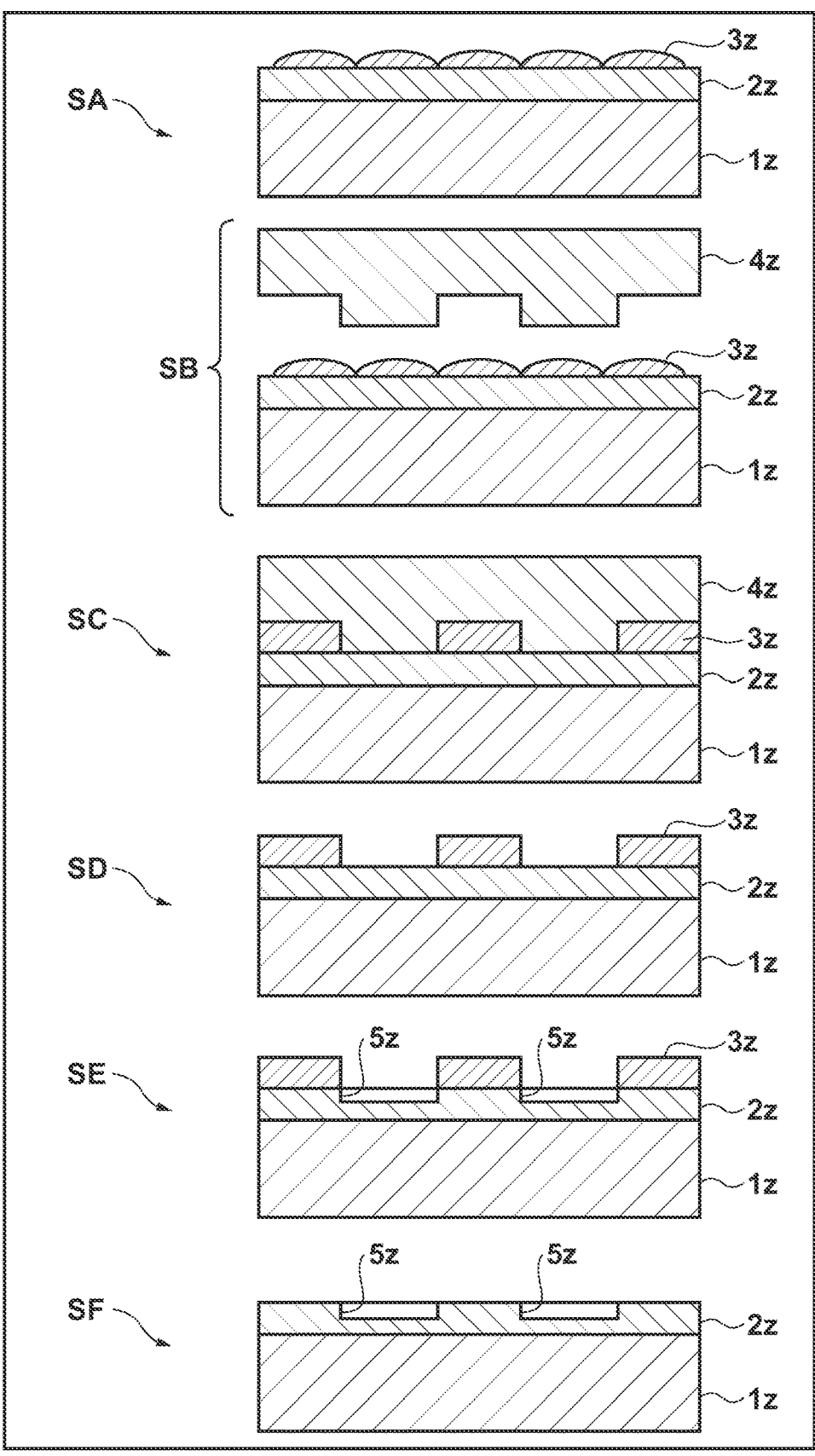
FIG. 9 is a view for describing an article manufacturing method.

As shown in step SB of FIG. 9, a side of a mold 4z for imprint with an uneven pattern is directed toward and made to face the imprint material 3z on the substrate. As shown in step SC of FIG. 9, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing via the mold 4z, the imprint material 3z is cured.

As shown in step SD of FIG. 9, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

As shown in step SE of FIG. 9, when etching is performed using the pattern of the cured product as an etching resistant mask, a portion of the surface of the processed material 2z where the cured product does not exist or remains thin is removed to form a groove 5z. As shown in step SF of FIG. 9, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-205992, filed Dec. 22, 2022, which is hereby incorporated by reference herein in its entirety.

What is claimed is:

1. An imprint device that forms a pattern on a shot region of a substrate by curing an imprint material by irradiating the imprint material with light through a mold in a state in which the imprint material on the shot region of a substrate and the mold are in contact with each other, the imprint device comprising:

an irradiator configured to at least partially irradiate a pattern region of the mold with light; and a controller;

wherein the controller is configured to:

determine a partial region of the pattern region including a boundary between a first region including one or more recessed portions having a depth exceeding a predetermined value and a second region that is adjacent to the first region and does not include a recessed portion having a depth exceeding the predetermined value, based on a relative difference in filling speed of the imprint material between the first region and the second region according to unevenness information of the pattern region; and set a light irradiation amount to the partial region by the irradiator to be larger than the light radiation amount to a region other than the partial region.

2. The imprint device according to claim 1, wherein the first region is a region including only one recessed portion having a depth exceeding the predetermined value.

3. The imprint device according to claim 1, wherein the first region is a chip pattern region including a plurality of recessed portions each having a depth exceeding the predetermined value, and the controller is configured to determine an outer peripheral portion of the chip pattern region as the partial region.

4. The imprint device according to claim 1, wherein the controller is configured to determine the partial region so that the partial region is located across the first region and the second region.

5. The imprint device according to claim 1, wherein the controller is configured to determine the partial region such that an entire region of the partial region is included in the first region and an end of the partial region is located at the boundary.

6. The imprint device according to claim 1, wherein the controller is configured to determine the partial region such that an entire region of the partial region is included in the second region and an end of the partial region is located at the boundary.

7. The imprint device according to claim 1, wherein the controller is configured to determine an additional partial region of the pattern region for obtaining a predetermined viscosity of the imprint material, and determine the partial region to include the additional partial region.

8. The imprint device according to claim 1, wherein the irradiator includes, a first irradiator configured to irradiate an entire surface of the pattern region with light, and a second irradiator configured to irradiate only the partial region with light.

9. The imprint device according to claim 8, wherein the controller is configured to:

control the second irradiator to perform preceding irradiation of light only on the partial region, perform alignment between the mold and the substrate after start of the preceding irradiation, and control the first irradiator to irradiate the entire surface of the pattern region with light after completion of the alignment.

10. An imprint method of forming a pattern on a shot region of a substrate by curing an imprint material using an irradiator that at least partially irradiates the shot region with light in a state in which the imprint material on the shot region of a substrate and a mold are in contact with each other, the imprint method comprising:

determining a partial region of the pattern region including a boundary between a first region including one or more recessed portions having a depth exceeding a predetermined value and a second region that is adjacent to the first region and does not include a recessed portion having a depth exceeding the predetermined value based on a relative difference in filling speed of the imprint material between the first region and the second region according to unevenness information of the pattern region;

controlling the irradiator to perform preceding irradiation of the partial region with light;

aligning the mold and the substrate after the start of the preceding irradiation; and controlling the irradiator to irradiate the entire surface of the pattern region with light after completion of the alignment.

11. An article manufacturing method comprising:

forming a pattern on a substrate by the imprint method described in claim 10; and processing the substrate on which the pattern is formed; and manufacturing an article from the substrate on which the processing has been performed.

* * * * *